(12) United States Patent
Lee et al.

(10) Patent No.: US 10,649,597 B2
(45) Date of Patent: May 12, 2020

(54) DISPLAY APPARATUS

(71) Applicant: Samsung Display Co., Ltd., Yongin-si (KR)

(72) Inventors: Byeong-jin Lee, Hwaseong-si (KR); Jinhwan Kim, Seoul (KR); Mi-ae Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 44 days.

(21) Appl. No.: 15/952,188

(22) Filed: Apr. 12, 2018

(65) Prior Publication Data

US 2018/0356917 A1    Dec. 13, 2018

(30) Foreign Application Priority Data

Jun. 13, 2017    (KR) .................. 10-2017-0074340

(51) Int. Cl.
  *G06F 3/044*    (2006.01)
  *G06F 3/041*    (2006.01)
  (Continued)

(52) U.S. Cl.
  CPC .............. *G06F 3/044* (2013.01); *G06F 3/041* (2013.01); *H01L 27/323* (2013.01); *H01L 27/3276* (2013.01); *H01L 51/0097* (2013.01); *H01L 51/5281* (2013.01); *H05K 1/147* (2013.01); *H05K 1/189* (2013.01); *H05K 3/285* (2013.01);
  (Continued)

(58) Field of Classification Search
  CPC .............. G06F 3/044; G06F 3/041; G06F 2203/04103; G06F 2203/04102; G06F 3/0412; H01L 2251/5338; H01L 27/3276; H01L 51/5281; H01L 51/0097; H01L 27/323; H05K 3/285; H05K 1/147; H05K 1/189; H05K 2201/041; H05K 2201/10151; H05K 2201/10128; H05K 2201/042

See application file for complete search history.

(56) References Cited

U.S. PATENT DOCUMENTS 9,985,086 B2 *    5/2018    Kwon .................. H01L 27/3276
10,302,996 B2 *    5/2019    Li ........................ G02F 1/13338
(Continued)

FOREIGN PATENT DOCUMENTS

JP    2005-158008    6/2005
JP    2013-114316    6/2013
(Continued)

*Primary Examiner* — Ibrahim A Khan
(74) *Attorney, Agent, or Firm* — H.C. Park & Associates, PLC

(57) ABSTRACT

A display apparatus includes a display panel, a touch sensor, an adhesive layer, a first flexible printed circuit board, and a second flexible printed circuit board. The touch sensor is disposed on the display panel. The adhesive layer is disposed between the display panel and the touch sensor. The first flexible printed circuit board and the second flexible printed circuit board are disposed between the display panel and the touch sensor. The first flexible printed circuit board is connected to the display panel, and the second flexible printed circuit board is connected to the touch sensor. The adhesive layer overlaps with the first flexible printed circuit board and is in contact with the first flexible printed circuit board and the touch sensor.

21 Claims, 15 Drawing Sheets

(51) Int. Cl.
   *H01L 27/32*   (2006.01)
   *H01L 51/00*   (2006.01)
   *H01L 51/52*   (2006.01)
   *H05K 1/18*    (2006.01)
   *H05K 1/14*    (2006.01)
   *H05K 3/28*    (2006.01)

(52) U.S. Cl.
   CPC ........... *G06F 2203/04102* (2013.01); *G06F 2203/04103* (2013.01); *H01L 2251/5338* (2013.01); *H05K 2201/041* (2013.01); *H05K 2201/042* (2013.01); *H05K 2201/10128* (2013.01); *H05K 2201/10151* (2013.01)

(56) References Cited

U.S. PATENT DOCUMENTS

| | | | |
|---|---|---|---|
| 2005/0099402 A1 | 5/2005 | Nakanishi et al. | |
| 2013/0271384 A1* | 10/2013 | Chuang | G06F 1/1643 345/173 |
| 2014/0353637 A1* | 12/2014 | Kawata | H01L 27/3272 257/40 |
| 2015/0009128 A1* | 1/2015 | Matsumoto | G06F 3/0412 345/156 |
| 2015/0144920 A1* | 5/2015 | Yamazaki | G06F 1/1652 257/40 |
| 2015/0248149 A1* | 9/2015 | Yamazaki | G06F 1/1652 361/679.27 |
| 2015/0261259 A1* | 9/2015 | Endo | G06F 1/1652 361/679.06 |
| 2016/0103649 A1* | 4/2016 | Yoshitani | G09G 3/20 345/694 |
| 2016/0202829 A1 | 7/2016 | Choi et al. | |
| 2016/0357288 A1 | 12/2016 | Chao et al. | |
| 2017/0090644 A1 | 3/2017 | Yao et al. | |

FOREIGN PATENT DOCUMENTS

| | | |
|---|---|---|
| JP | 2015-184961 | 10/2015 |
| KR | 10-2016-0078409 | 7/2016 |
| KR | 10-2016-0087467 | 7/2016 |
| KR | 10-2016-0108477 | 9/2016 |
| KR | 10-1712246 | 3/2017 |

\* cited by examiner

DISPLAY APPARATUS

CROSS-REFERENCE TO RELATED APPLICATION

This application claims priority from and the benefit of Korean Patent Application No. 10-2017-0074340, filed on Jun. 13, 2017, which is hereby incorporated by reference for all purposes as if fully set forth herein.

BACKGROUND

Filed

Exemplary implementations of the invention relate generally to a display apparatus and, more specifically, to a flexible display apparatus capable of preventing internal components, such as a touch insulating layer and touch patterns from being damaged when the display apparatus is folded.

Discussion of the Background

A recent display apparatus may display an image and may also sense an external input such as a touch input of a user. In addition, a display apparatus having flexibility has been developed. The display apparatus may be bent on a specific axis. Thus, techniques for forming flexible modules (e.g., a display panel and a touch panel) included in a display apparatus have been developed.

Bending of a display apparatus may have various impacts upon the display apparatus, such as foreign material may permeate into a display apparatus.

The above information disclosed in this Background section is only for understanding of the background of the inventive concepts, and, therefore, it may contain information that does not constitute prior art.

SUMMARY

Display apparatus constructed according to the principles and exemplary implementations of the invention are capable of preventing internal components, such as a touch insulating layer and touch patterns, from being damaged when the display apparatus is folded.

Also, display apparatus constructed according to the principles and exemplary implementations of the invention are capable of preventing a malfunction of a touch sensing unit such as which may occur by water permeating into the touch insulating layer.

Additional features of the inventive concepts will be set forth in the description which follows, and in part will be apparent from the description, or may be learned by practice of the inventive concepts.

According to one aspect of the invention, a display apparatus includes a display panel to display an image, a touch sensor, an adhesive layer, a first flexible printed circuit board, and a second flexible printed circuit board.

The touch may be disposed on the display panel.

The adhesive layer may be disposed between the display panel and the touch sensor.

The first flexible printed circuit board may be disposed between the display panel and the touch sensor and may be connected to the display panel.

The second flexible printed circuit board may be disposed between the display panel and the touch sensor and may be connected to the touch sensor.

The adhesive layer may overlap with the first flexible printed circuit board and may be in contact with the first flexible printed circuit board and the touch sensor.

The touch sensor in a touch sensing unit may include a base layer, touch patterns, and a touch insulating layer.

The touch patterns may be disposed under the base layer.

The touch insulating layer may be disposed under the touch patterns to cover the touch patterns.

The adhesive layer may be in contact with the touch insulating layer.

The display apparatus may further include an anti-reflection layer disposed between the display panel and the touch sensing unit. The adhesive layer may be disposed between the display panel and the anti-reflection layer.

The display apparatus may further include an anti-reflection layer disposed between the display panel and the touch sensing unit. The adhesive layer may be disposed between the touch sensing unit and the anti-reflection layer.

The adhesive layer may be disposed between the first flexible printed circuit board and the second flexible printed circuit board and may be in contact with the first flexible printed circuit board and the second flexible printed circuit board.

The display apparatus may further include an anti-reflection layer disposed between the display panel and the touch sensing unit. The adhesive layer may include a first adhesive layer and a second adhesive layer. The first adhesive layer may be disposed between the display panel and the anti-reflection layer. The second adhesive layer may be disposed between the anti-reflection layer and the touch sensing unit.

The display apparatus may further include a window member and an anti-reflection layer. The window member may be disposed on the touch sensing unit. The anti-reflection layer may be disposed between the touch sensing unit and the window member. The adhesive layer may be in contact with the display panel and the touch sensing unit to adhere the display panel and the touch sensing unit to each other.

According to another aspect of the invention, a display apparatus includes a display panel, a touch sensing unit, an adhesive layer, and a first flexible printed circuit board.

The display panel may include a touch screen surface to display an image and may be foldable on a folding axis such that the touch screen surface faces outward.

The touch sensing unit may be disposed on the display panel.

The adhesive layer may be disposed between the display panel and the touch sensing unit.

The first flexible printed circuit board may be disposed between the display panel and the touch sensing unit and may be connected to the display panel.

The touch sensing unit may include a base layer, touch patterns, and a touch insulating layer.

The touch patterns may be disposed under the base layer.

The touch insulating layer may be disposed under the touch patterns to cover the touch patterns.

The base layer may be further from the display panel than the touch insulating layer may be. The adhesive layer may overlap with the first flexible printed circuit board and may be in contact with the first flexible printed circuit board and the touch insulating layer.

The display apparatus may further include a second flexible printed circuit board disposed between the display panel and the touch sensing unit and connected to the touch sensing unit. The adhesive layer may be disposed between the first and second flexible printed circuit boards to adhere the first and second flexible printed circuit boards to each other.

The display apparatus may further include an anti-reflection layer disposed between the display panel and the touch sensing unit. The adhesive layer may be disposed between the display panel and the anti-reflection.

The display apparatus may further include an anti-reflection layer disposed between the display panel and the touch sensing unit. The adhesive layer may be disposed between the touch sensing unit and the anti-reflection layer.

According to still another aspect of the invention, a display apparatus includes a display panel displaying an image, a touch sensor, an adhesive layer, and a first flexible printed circuit board.

The touch sensing unit may be disposed on the display panel.

The adhesive layer may be disposed between the display panel and the touch sensor.

The first flexible printed circuit board may be disposed between the display panel and the touch sensing unit and may be connected to the display panel.

The adhesive layer may be in contact with a top surface and a side surface of the first flexible printed circuit board.

It is to be understood that both the foregoing general description and the following detailed description are exemplary and explanatory and are intended to provide further explanation of the invention as claimed.

According to still another aspect of the invention, a display apparatus includes a foldable display panel including a touch screen to display an image, a touch sensing unit disposed on the display panel including touch patterns and a touch insulating layer covering the touch patterns, an adhesive layer disposed between the display panel and the touch sensing unit, and at least one flexible printed circuit board having a corner and being disposed between the display panel and the touch sensing unit, and connected for rotation with the display panel. The adhesive layer may protect the corner of the at least one flexible printed circuit board from contacting the touch insulation layer upon rotation of the display panel during folding of the display panel.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
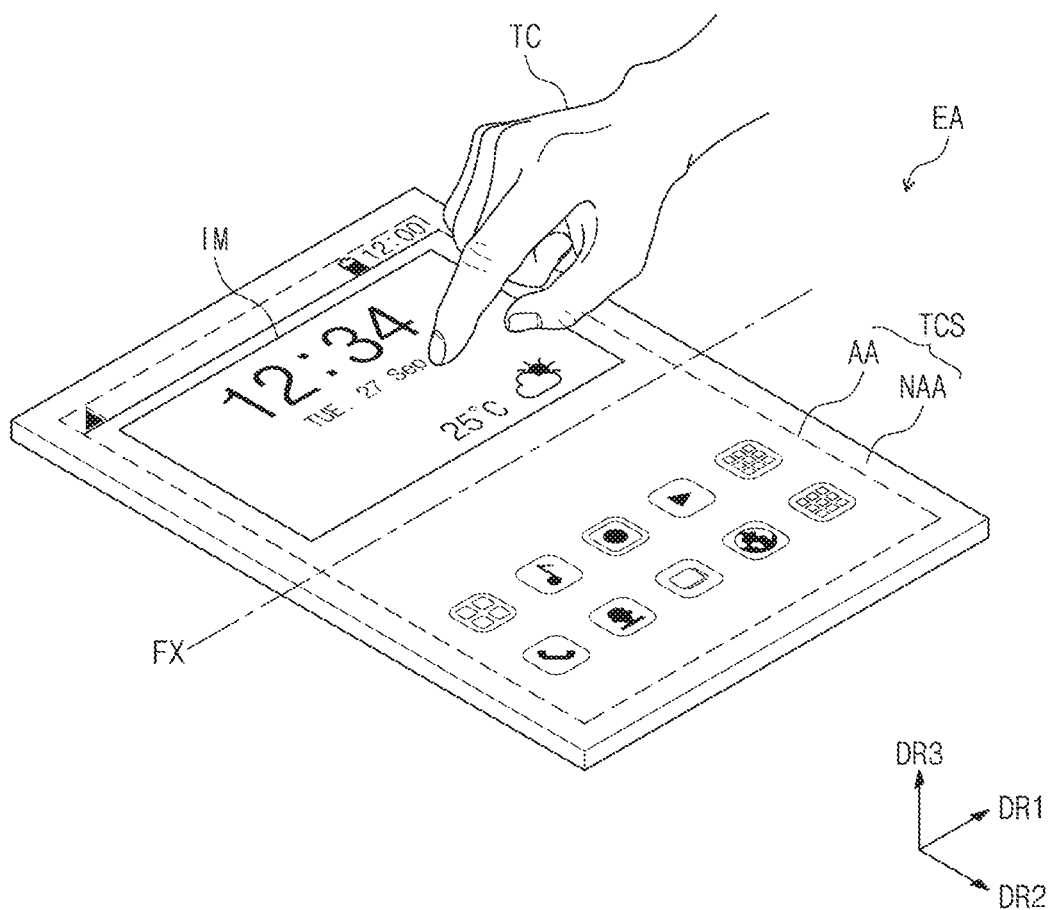
FIG. 1 is a schematic perspective view of an exemplary embodiment of a display apparatus constructed according to the principles of the invention in an expanded, generally flat configuration.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
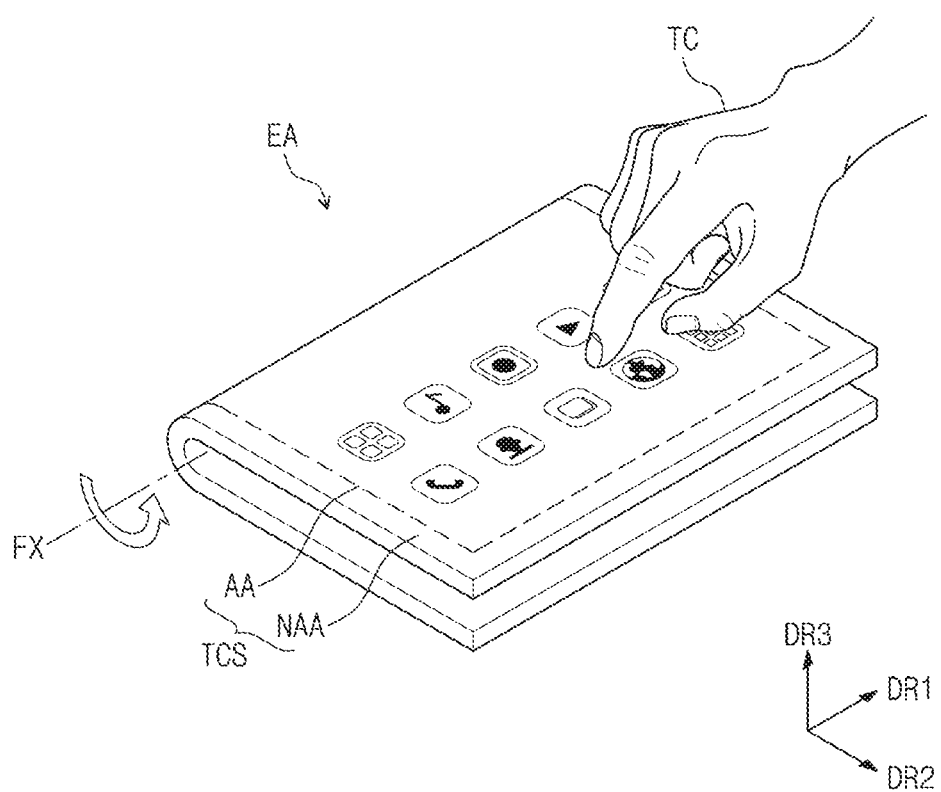
FIG. 2 is a perspective view of the display apparatus of FIG. 1 in a compact, folded position.

FIG. 1 is a schematic perspective view of an exemplary embodiment of a display apparatus constructed according to the principles of the invention in an expanded, generally flat configuration, and FIG. 2 is a perspective view of the display apparatus of FIG. 1 in a compact, folded position.

FIG. 1 is a perspective view illustrating a display apparatus EA in a first mode in which the display is in an expanded position, and FIG. 2 is a perspective view illustrating the display apparatus EA in a second mode in which the display is in a compact position. The first and second modes may be operated at different times from each other.

Referring to FIGS. 1 and 2, the display apparatus EA may be a touch screen apparatus. For example, the touch screen apparatus may be at least one of a smart phone, a tablet personal computer, a mobile phone, an e-book reader, a note book, a personal digital assistant (PDS), a portable multimedia player (PMP), an MP3 player, a mobile medical device, a camera, or a wearable display apparatus.

The display apparatus EA provides a touch screen surface TCS. The touch screen surface TCS may be the outermost surface of the display apparatus EA. In addition, the touch screen surface TCS may be exposed to the outside to provide an image to a user and may be a surface onto which an external input TC is provided.

The touch screen surface TCS may include an active area AA and a peripheral area NAA in a plan view. The active area AA of the touch screen surface TCS may display an image IM to provide information to a user and/or to communicate with a user. In addition, the to active area AA of the touch screen surface TCS may sense the external input TC. In this illustrated embodiment, the external input TC is a finger of a user. However, embodiments of the invention are not limited thereto. In other embodiments, the external input TC may be a stylus pen, hovering input or other type of input, depending on the sensing element included in the display apparatus EA.

The peripheral area NAA may not display the image IM and may not sense the external input TC. However, the display apparatus EA may sense the external input TC on a partial area of the peripheral area NAA adjacent to the active area AA, due to pixel arrangement of a display panel of the display apparatus EA and the electrode structure of a touch sensing unit of the display apparatus EA.

The peripheral area NAA may overlap with signal lines for supplying signals provided from the outside to the active area AA and/or driving elements for driving the active area AA.

In this illustrated embodiment, the peripheral area NAA has a frame shape surrounding the active area AA. However, embodiments of the invention are not limited thereto. In other embodiments, the shape of the peripheral area NAA may be variously modified. In still other embodiments, the peripheral area NAA may be omitted.

A shape of the display apparatus EA may be variously modified. However, in this illustrated embodiment, the display apparatus EA may have a short side extending in a first direction DR1 and a long side extending in the second direction DR2. A thickness direction of the display apparatus EA may be defined as a third direction DR3.

The display apparatus EA according to an embodiment of the invention may be folded or unfolded on a folding axis FX. The folding axis FX is defined as a line extending in the first direction DR1.

FIG. 1 illustrates the display apparatus EA in the first mode. The first mode may be a state in which the display apparatus EA is unfolded. In the first mode, external stress applied to the display apparatus EA except for the external input TC may be zero. Thus, the shape of the display apparatus EA is not deformed in the first mode.

FIG. 2 illustrates the display apparatus EA in the second mode. The second mode may be a state in which the display apparatus EA is folded on the folding axis FX in one direction. During the second mode, the display apparatus EA may be folded (hereinafter, referred to as out-folded) in such a way that the touch screen surface TCS having the active area AA faces outward. During the second mode, the display apparatus EA may sense the external input TC provided from the outside or provide the image IM in the state in which the display apparatus EA is folded.

In the second mode, external stress may be applied to the display apparatus EA and the shape of the display apparatus EA may be deformed. Tensile stress or compressive stress may be applied to elements disposed in the display apparatus EA in the second mode, and structures of the elements disposed in the display apparatus EA may be determined in consideration of the stress. These will be described later in more detail.

FIG. 2 illustrates the case in which the display apparatus EA is out-folded in the second mode. However, embodiments of the invention are not limited thereto. For example, in other embodiments, the display apparatus EA may be in-folded in the second mode.

Figure 3:
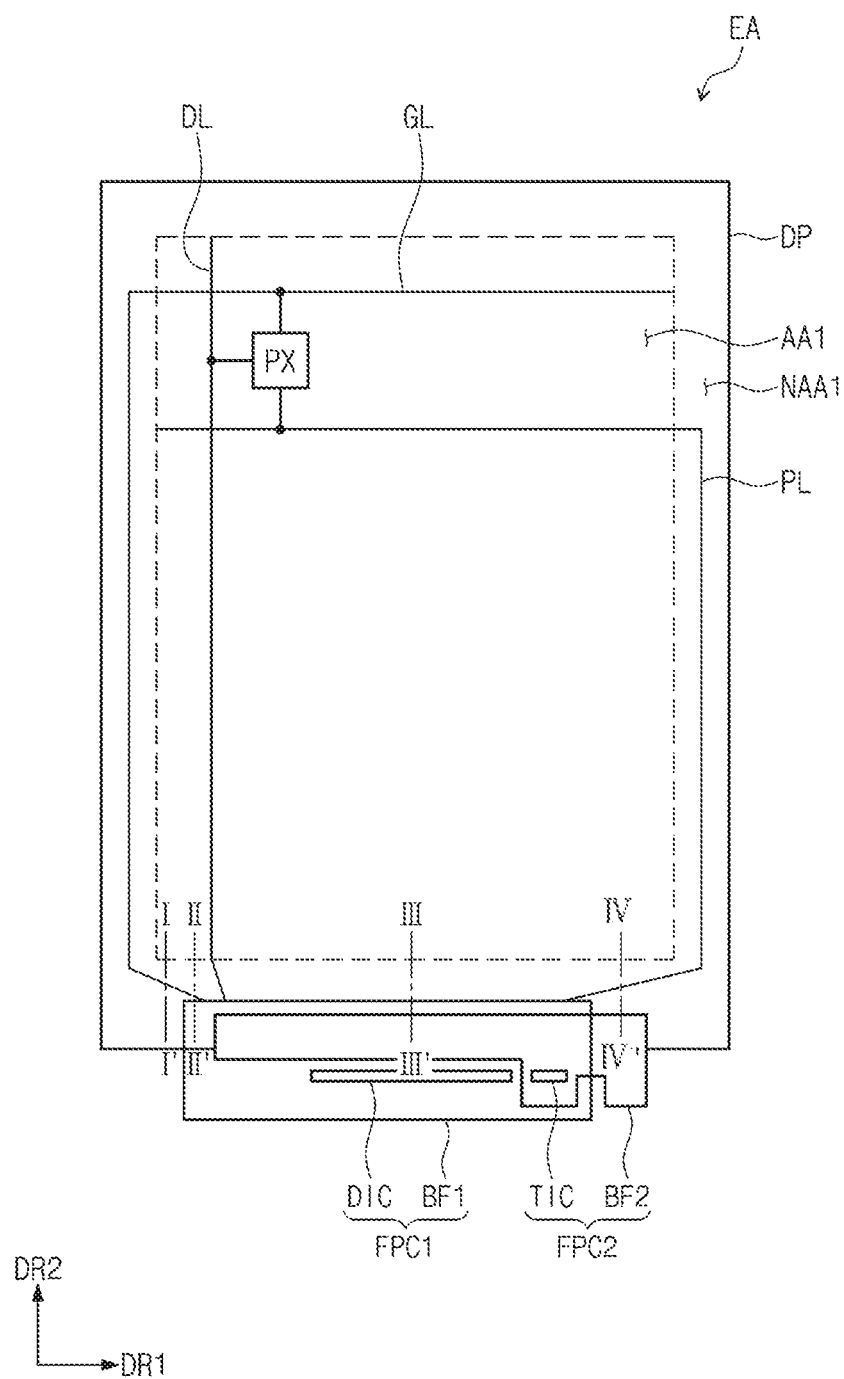
FIG. 3 is a plan view of the display apparatus of FIGS. 1-2.

FIG. 3 is a plan view of the display apparatus EA of FIGS. 1-2.

Referring to FIG. 3, the display apparatus EA may include a display panel DP, a touch sensing unit, a first flexible printed circuit board FPC1, and a second flexible printed circuit board FPC2.

The display panel DP may be, but is not limited to, a light-emitting display panel. For example, the display panel DP may be an organic light-emitting display panel or a quantum dot light-emitting display panel. The organic light-emitting display panel includes a light-emitting layer including an organic light-emitting material. The quantum dot light-emitting display panel includes a light-emitting layer including quantum dots and/or quantum rods. Hereinafter, the display panel DP will be described as an organic light-emitting display panel as an example.

The display panel DP may include an active area AA1 and a peripheral area NAA1. The active area AA1 and the peripheral area NAA1 of the display panel DP may be substantially the same as the active area AA and the peripheral area NAA illustrated in FIG. 1 when viewed in a plan view. The display panel DP may display an image on the active area AA1 but may not display an image on the peripheral area NAA1.

The display panel DP may include a plurality of signal lines and a pixel PX.

The signal lines may include a scan line GL, a data line DL, and a power line PL. Each of the scan line GL, the data line DL and the power line PL may be provided in plurality. However, one scan line GL, one data line DL and one power line PL are illustrated as an example in FIG. 3. The scan line GL, the data line DL and the power line PL are connected to the pixel PX. The scan line GL, the data line DL and the power line PL may be connected to the first flexible printed circuit board FPC1 to receive a driving signal.

The display panel DP may include a scan driving circuit disposed in the peripheral area NAA1. The scan driving circuit may receive the driving signal from the first flexible printed circuit board FPC1 and may provide a scan signal to the scan line GL.

The pixel PX may be connected to the scan line GL and the data line DL to display an image. The pixel PX may display one of a red color, a green color, and a blue color. However, embodiments of the invention are not limited thereto. In certain embodiments, the pixel PX may display another color (e.g., a white color) besides the red color, the green color, and the blue color. The pixel PX is illustrated in FIG. 1 as having a quadrilateral shape as an example. However, embodiments of the invention are not limited thereto. In other embodiments, the pixel PX may have one of other various shapes such as a polygonal shape, a circular shape, and an elliptical shape.

The first flexible printed circuit board FPC1 may adhere to the peripheral area NAA1 of the display panel DP.

The first flexible printed circuit board FPC1 may include a first base film BF1 and a driving circuit chip DIC.

The first base film BF1 may adhere to the display panel DP and may include interconnection lines connecting the driving circuit chip DIC to the display panel DP. The first base film BF1 may be flexible. Thus, the first base film BF1 may be bent to a back surface of the display panel DP in a state in which it is connected to the display panel DP.

The driving circuit chip DIC provides a signal necessary for driving the display panel DP. The driving circuit chip DIC may be a source driver integrated circuit that provides a data signal to the data line DL. However, embodiments of the invention are not limited thereto. In other embodiments, the driving circuit chip DIC may be a combined driver integrated circuit that includes the source driver integrated circuit and the scan driving circuit providing the scan signal to the scan line GL. In this case, the scan driving circuit may not be disposed in the display panel DP.

The second flexible printed circuit board FPC2 may adhere to a peripheral area of the touch sensing unit. The touch sensing unit is not illustrated in FIG. 3 for the purpose of ease and convenience in description and illustration. However, the touch sensing unit may have substantially the same shape as the display panel DP when viewed in a plan view.

The second flexible printed circuit board FPC2 may overlap with the first flexible printed circuit board FPC1. In addition, the second flexible printed circuit board FPC2 may also overlap with the display panel DP.

The second flexible printed circuit board FPC2 may include a second base film BF2 and a touch circuit chip TIC.

The second base film BF2 may adhere to the touch sensing unit and may include interconnection lines connecting the touch circuit chip TIC to the touch sensing unit. The second base film BF2 may be flexible. Thus, the second base film BF2 may be bent to the back surface of the display panel DP in a state in which it is connected to the touch sensing unit.

The touch circuit chip TIC may provide a touch driving signal necessary for driving the touch sensing unit and may receive a sensing signal from the touch sensing unit.

The display apparatus EA may further include a main printed circuit board and a touch printed circuit board. The main printed circuit board may be connected to the first flexible printed circuit board FPC1 to exchange signals with the first flexible printed circuit board FPC1. The touch printed circuit board may be connected to the second flexible printed circuit board FPC2 to exchange signals with the second flexible printed circuit board FPC2. The main printed circuit board may be electrically connected to the touch printed circuit board. However, embodiments of the invention are not limited thereto. The main printed circuit board may be integrated with the touch printed circuit board as a single unitary printed circuit board.

Figure 4:
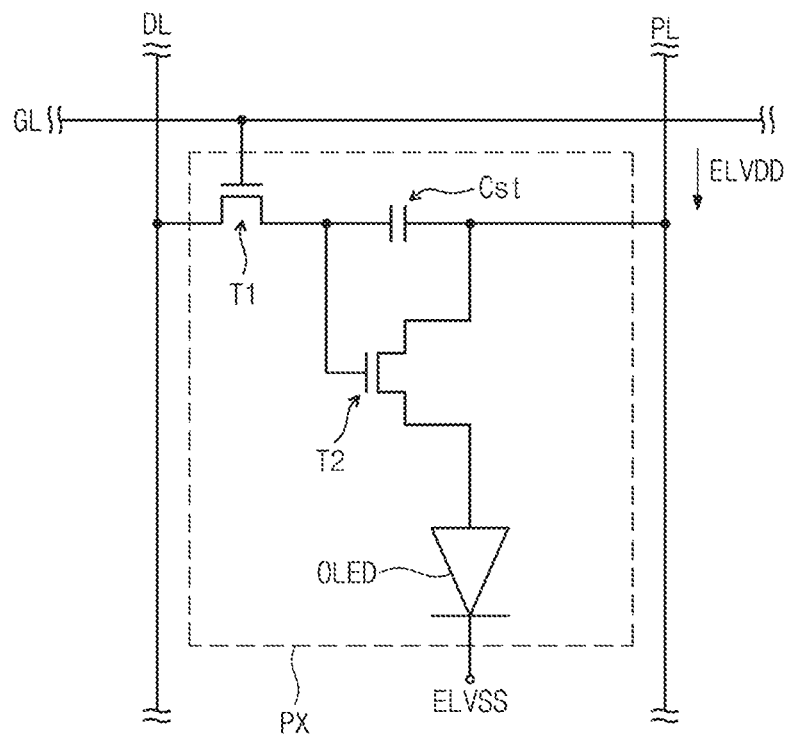
FIG. 4 is an equivalent circuit diagram of a pixel of FIG. 3.

FIG. 4 is an equivalent circuit diagram of a pixel PX of FIG. 3. FIG. 4 illustrates the pixel PX connected to one scan line GL, one data line DL and one power line PL as an example. However, the configuration of the pixel PX is not limited to FIG. 4 but may be variously modified.

An organic light-emitting diode OLED may be a front surface light-emitting type diode or a back surface light-emitting type diode. The pixel PX includes a first transistor (or a switching transistor) T1, a second transistor (or a driving transistor) T2 and a capacitor Cst which constitute a pixel driving circuit for driving the organic light-emitting diode OLED. A first power source voltage ELVDD is provided to the second transistor T2, and a second power source voltage ELVSS is provided to the organic light-emitting diode OLED. The second power source voltage ELVSS may be lower than the first power source voltage ELVDD.

The first transistor T1 outputs a data signal, applied to the data line DL, in response to a scan signal applied to the scan line GL. The capacitor Cst is charged with a voltage corresponding to the data signal received from the first transistor T1.

The second transistor T2 is connected to the organic light-emitting diode OLED. The second transistor T2 controls a driving current flowing through the organic light-emitting diode OLED in response to the amount of charges stored in the capacitor Cst. The organic light-emitting diode OLED emits light during a turn-on period of the second transistor T2.

Figure 5:
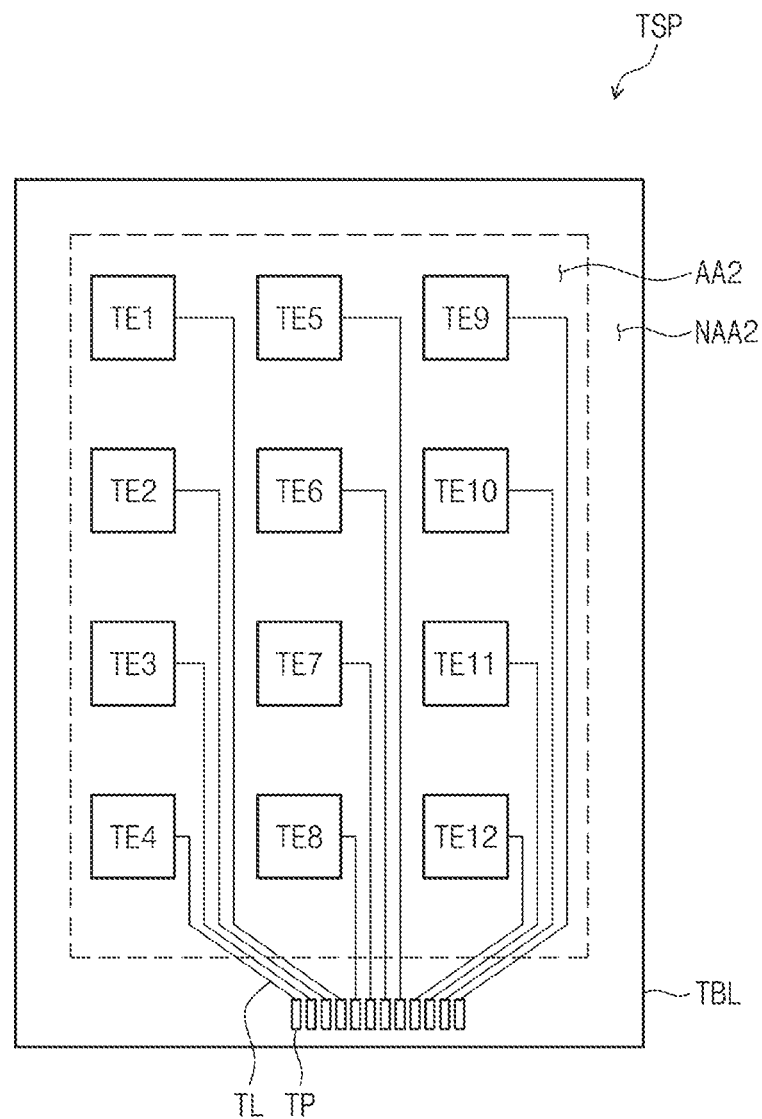
FIG. 5 is a plan view of the touch sensing unit of FIGS. 1-2.

FIG. 5 is a plan view of the touch sensing unit of FIGS. 1-2.

A touch sensing unit TSP may be operated by a capacitive method. The touch sensing unit TSP may be operated by a method of extracting touch coordinates based on a variation in capacitance of a capacitor formed by two kinds of touch electrodes extending in different directions and insulated from each other, or by a method of extracting touch coordinates based on variations in capacitance of capacitors formed by a plurality of touch electrodes disposed in an active area. In the following embodiment, the touch sensing unit TSP operated by the latter method will be described as an example.

The touch sensing unit TSP may include an active area AA2 and a peripheral area NAA2. The active area AA2 and the peripheral area NAA2 of the touch sensing unit TSP may be substantially the same as the active area AA and the peripheral area NAA illustrated in FIG. 1 when viewed in a plan view. The touch sensing unit TSP may sense a touch inputted to the active area AA2 but may not sense a touch inputted to the peripheral area NAA2.

The touch sensing unit TSP may include a base layer TBL and touch patterns TPL. The touch patterns TPL may include touch electrodes TE1 to TE12, touch interconnection lines TL, and touch pads TP.

The touch electrodes TE1 to TE12 may be disposed on the base layer TBL. The touch electrodes TE1 to TE12 may be disposed in the active area AA2.

The touch electrodes TE1 to TE12 may be disposed on the same layer. The touch electrodes TE1 to TE12 may be arranged in a matrix form. The touch electrodes TE1 to TE12 are illustrated in FIG. 5 arranged in a 4×3 matrix form and having quadrilateral shapes when viewed in a plan as an example. However, embodiments of the invention are not limited thereto. In certain embodiments, the number, the arrangement and the shapes of the touch electrodes TE1 to TE12 may be variously changed.

The touch interconnection lines TL may connect the touch electrodes TE1 to TE12 to the touch pads TP. Since the touch interconnection lines TL are connected to the touch electrodes TE1 to TE12, respectively, the number of the touch interconnection lines TL may be equal to the number of the touch electrodes TE1 to TE12.

The touch pads TP may be disposed in the peripheral area NAA2. The second flexible printed circuit board FPC2 of FIG. 3 may provide the touch driving signals to the touch electrodes TE1 to TE12 through the touch pads TP and the touch interconnection lines TL. When a touch of a user is inputted to the touch sensing unit TSP, a capacitance of a capacitor formed by at least one touch electrode overlapping with the touch input of the user may be varied and a characteristic (e.g., signal delay) of the touch driving signal provided to the at least one touch electrode may be varied. The second flexible printed circuit board FPC2 may receive the characteristic variation of the touch driving signal provided to the at least one electrode as a sensing signal and may calculate touch coordinates of the user.

In this illustrated embodiment, the touch patterns TPL have shapes formed by patterning a conductive layer using a single mask. However, embodiments of the invention are not limited thereto. In other embodiments, the touch patterns TPL may include two or more patterned conductive layers and an insulating layer disposed between the two or more patterned conductive layers.

FIGS. 6A, 6B, 6C, and 6D are cross-sectional views of the display apparatus shown in FIG. 3 taken along lines I-I', II-II', III-III', and IV-IV', respectively, illustrating a display apparatus according to one exemplary embodiment.

Referring to FIGS. 6A to 6D, the display apparatus EA may further include a window member WD and an anti-reflection layer RF.

The window member WD may be disposed on the touch sensing unit TSP. The window member WD may include a flexible member. The window member WD may be transparent or semitransparent. A light shielding member for absorbing or reflecting incident light may be provided under the window member WD overlapping with the peripheral area NAA.

The anti-reflection layer RF may prevent reflection caused by external light. The anti-reflection layer RF may be realized in, but is not limited to, a film form. In some embodiments, the anti-reflection layer RF may have a structure including a plurality of stacked films and/or may have a structure in which a linear polarization plate and a circular polarization plate are stacked.

In some exemplary embodiments, the anti-reflection layer RF may be disposed between the touch sensing unit TSP and the display panel DP.

The touch sensing unit TSP may include the base layer TBL and the touch patterns TPL and may further include a touch insulating layer TIN. In FIGS. 6A to 6D, some of the touch patterns TPL may be the touch electrodes TE, others thereof may be the touch interconnection lines TL, and the others thereof may be the touch pads TP.

The touch patterns TPL may be disposed under the base layer TBL. In other words, the touch patterns TPL may be disposed on a bottom surface of the base layer TBL.

The touch insulating layer TIN may be disposed under the touch patterns TPL. The touch insulating layer TIN may cover at least some of the touch patterns TPL. For example, the touch insulating layer TIN may cover the touch electrodes TE1 to TE12 (see FIG. 5) and the touch interconnection lines TL (see FIG. 5) to prevent the touch electrodes TE1 to TE12 and the touch interconnection lines TL from being exposed. The touch insulating layer TIN may expose the touch pad TP.

The touch insulating layer TIN may be formed of an organic insulating material and/or an inorganic insulating material.

The touch sensing unit TSP may be formed by sequentially depositing and patterning the touch patterns TPL and the touch insulating layer TIN on the base layer TBL. Since the base layer TBL is a substrate on which a deposition process is performed, the thickness of the base layer TBL may be greater than that of the touch insulating layer TIN formed by the deposition process.

The display apparatus EA is out-folded in the second mode, and thus stress may be applied to the touch patterns TPL. Since first to third adhesive layers AD1 to AD3 provided in the display apparatus EA are formed of materials having high elasticity, a plurality of neutral planes may be formed between the first to third adhesive layers AD1 to AD3 when the display apparatus EA is out-folded.

Since the thickness of the base layer TBL is greater than that of the touch insulating layer TIN, touch neutral plane NT1 in the touch sensing unit TSP is formed in the base layer TBL when the display apparatus EA is out-folded. In the touch sensing unit TSP, compressive stress is applied to a portion disposed under the touch neutral plane NT1 and tensile stress is applied to a portion disposed on the touch neutral plane NT1.

The touch patterns TPL may include a conductive material of which a compressive strength is higher than a tensile strength. For example, the touch patterns TPL may include indium tin oxide (ITO) and/or indium zinc oxide (IZO).

In some exemplary embodiments, the base layer TBL is closer to the window member WD than the touch insulating layer TIN to apply the compressive stress to the touch patterns TPL when the display apparatus EA is out-folded. In other words, the distance between the base layer TBL and the window member WD is smaller than the distance between the touch insulating layer TIN and the window member WD. Thus, it is possible to prevent the touch patterns TPL from being damaged or broken by the tensile stress.

Figure 6A:
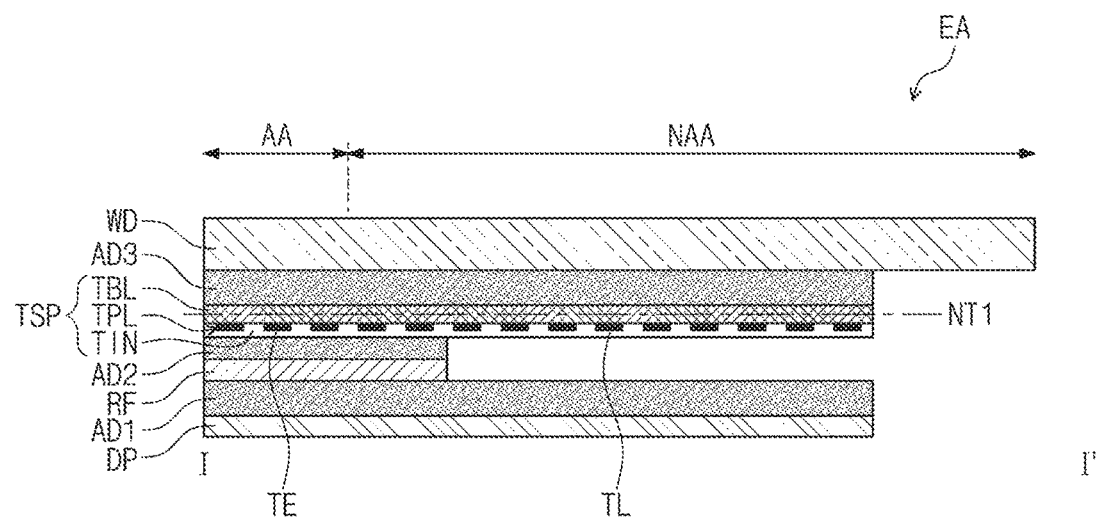
FIGS. 6A, 6B, 6C, and 6D are cross-sectional views of the display apparatus shown in FIG. 3 taken along lines I-I', II-II', III-III', and IV-IV', respectively, illustrating a display apparatus according to one exemplary embodiment.
Figure 6B:
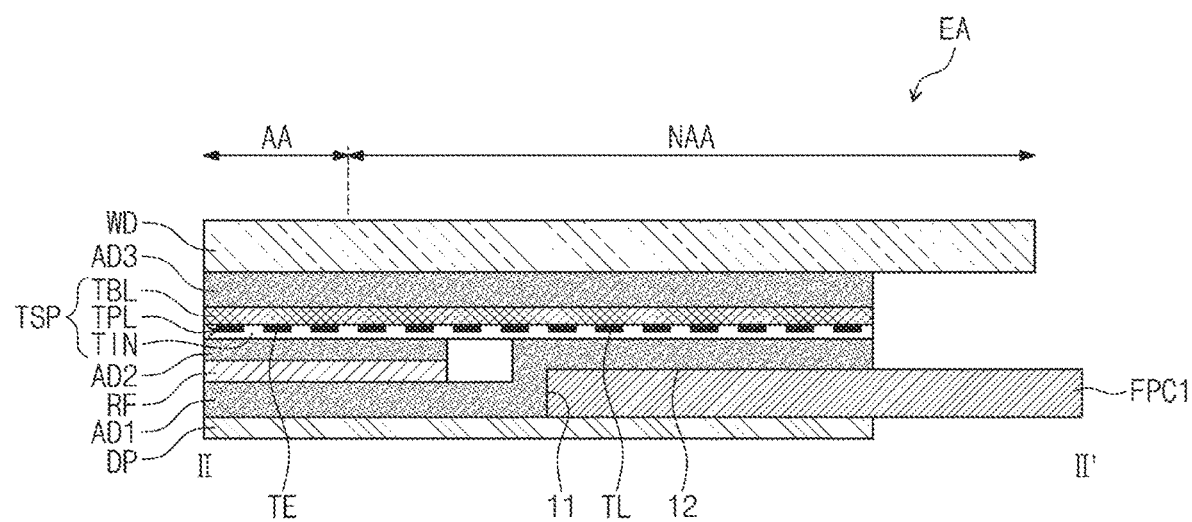
Figure 6C:
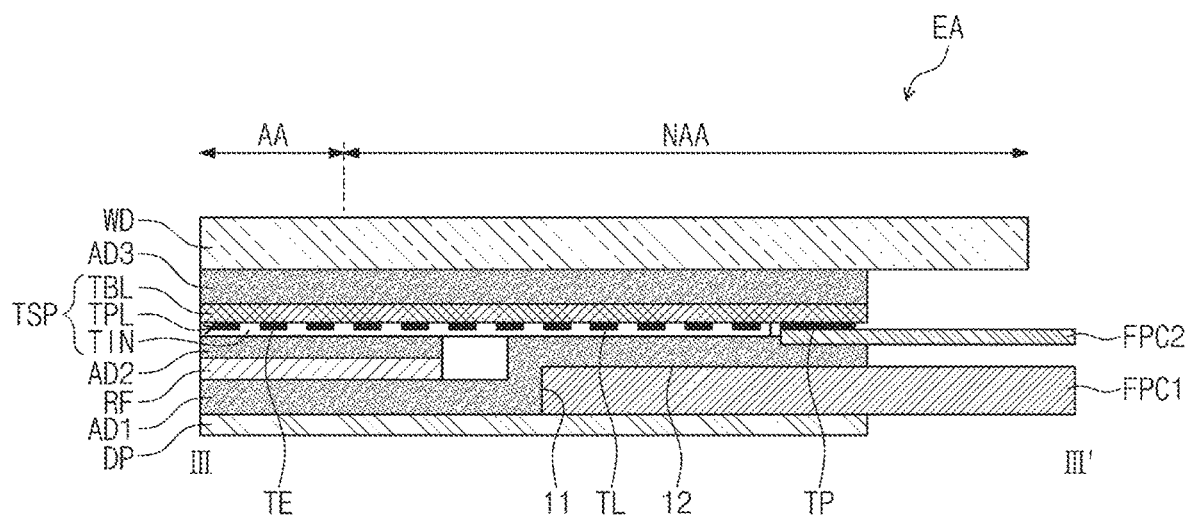
Figure 6D:
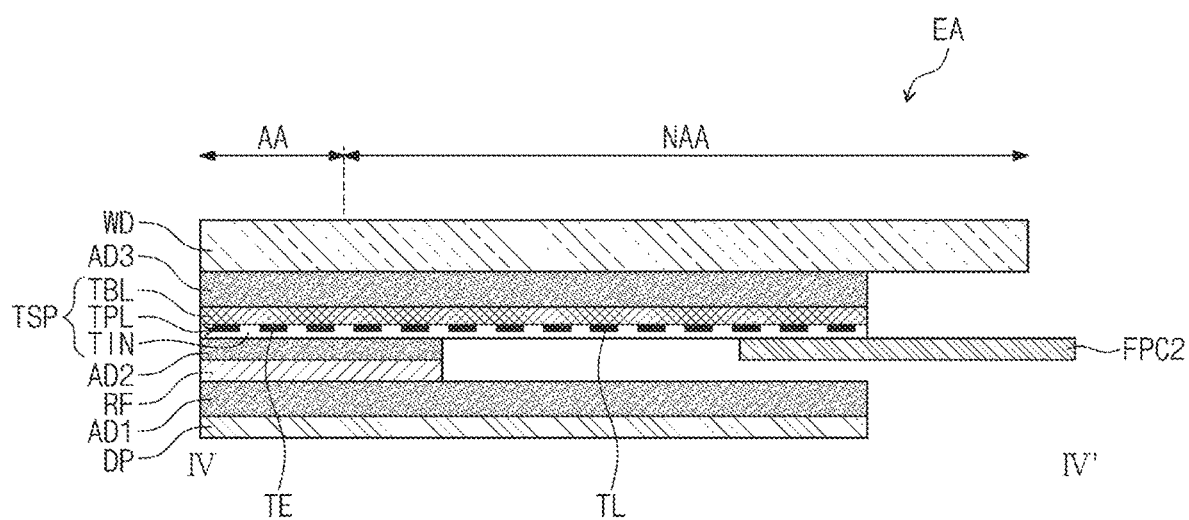

Referring to FIG. 6C, the first flexible printed circuit board FPC1 and the second flexible printed circuit board FPC2 may be disposed between the display panel DP and the touch sensing unit TSP.

The first flexible printed circuit board FPC1 may be disposed on the display panel DP and may be in contact with signal pads disposed at the display panel DP.

The second flexible printed circuit board FPC2 may be disposed under the touch sensing unit TSP and may be in contact with the touch pad TP exposed by the touch insulating layer TIN.

In some exemplary embodiments, the display apparatus EA may further include the first to third adhesive layers AD1 to AD3.

Each of the first to third adhesive layers AD1 to AD3 may include a material having adhesive strength, for example, an optical clear adhesive (OCA), an optical clear resin (OCR), or a pressure sensitive adhesive (PSA).

The first adhesive layer AD1 may be disposed between the display panel DP and the anti-reflection layer RF to adhere the display panel DP and the anti-reflection layer RF to each other.

The first adhesive layer AD1 may overlap with the peripheral area NAA as well as the active area AA. Referring to FIG. 6B, the first adhesive layer AD1 may be in contact with a side surface 11 and a top surface 12 of the first flexible printed circuit board FPC1. The first adhesive layer AD1 may be in contact with the touch insulating layer TIN of the touch sensing unit TSP. Referring to FIG. 6C, the first adhesive layer AD1 may be disposed between the first and second flexible printed circuit boards FPC1 and FPC2 and may be in contact with the first and second flexible printed circuit boards FPC1 and FPC2 to adhere the first and second flexible printed circuit boards FPC1 and FPC2 to each other.

In a process of manufacturing the display apparatus EA, the first adhesive layer AD1 may be formed on the display panel DP, and then, the touch sensing unit TSP may be laminated on the display panel DP on which the first adhesive layer AD1 is disposed. Since the first adhesive layer AD1 has the elasticity, the first adhesive layer AD1 may include areas having different thicknesses due to a difference between the pressures applied in the lamination process of the display panel DP and the touch sensing unit TSP.

The second adhesive layer AD2 may be disposed between the touch sensing unit TSP and the anti-reflection layer RF to adhere the touch sensing unit TSP and the anti-reflection layer RF to each other.

The second adhesive layer AD2 may be in contact with the touch insulating layer TIN. Referring to FIGS. 6B and 6C, the second adhesive layer AD2 may not overlap with the first flexible printed circuit board FPC1 and may be spaced apart from the first flexible printed circuit board FPC1.

The touch insulating layer TIN may be in contact with the first and second adhesive layers AD1 and AD2 and may be mostly covered by the first and second adhesive layers AD1 and AD2. In FIGS. 6A to 6D, the first adhesive layer AD1 and the second adhesive layer AD2 expose a portion of the touch insulating layer TIN in consideration of a tolerance in a manufacturing process. However, embodiments of the invention are not limited thereto. In other embodiments, the first adhesive layer AD1 and the second adhesive layer AD2 may not expose the touch insulating layer TIN.

The third adhesive layer AD3 may be disposed between the touch sensing unit TSP and the window member WD to adhere the touch sensing unit TSP and the window member WD to each other.

Figure 7:
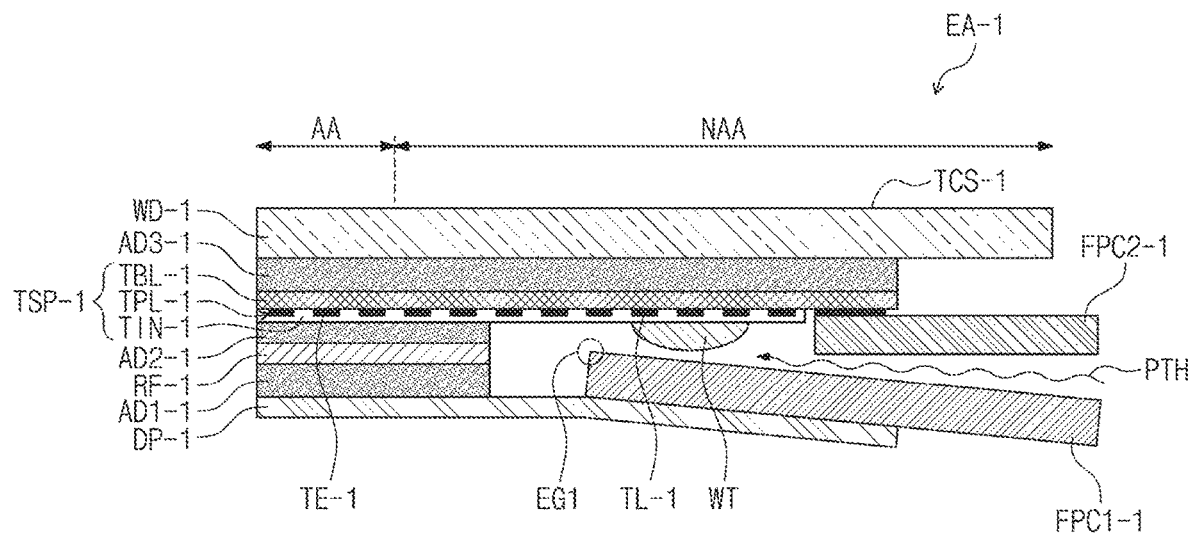
FIG. 7 is a cross-sectional view of a display apparatus according to a comparative, conventional example.
Figure 8:
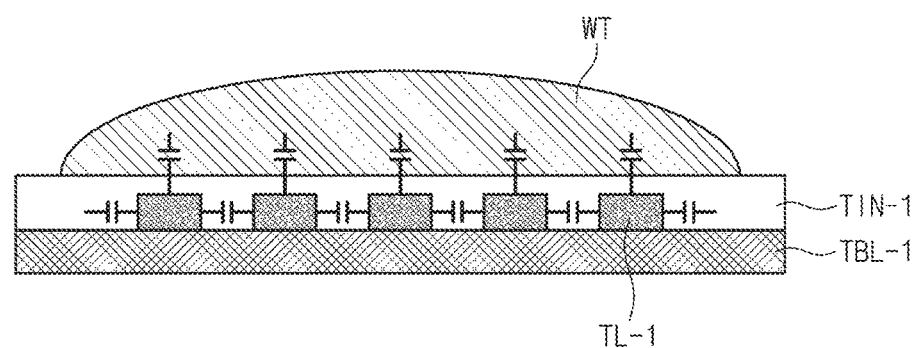
FIG. 8 is a schematic view illustrating a touch sensing unit when water permeates into the touch screen panel of the display apparatus of FIG. 7.
Figure 9A:
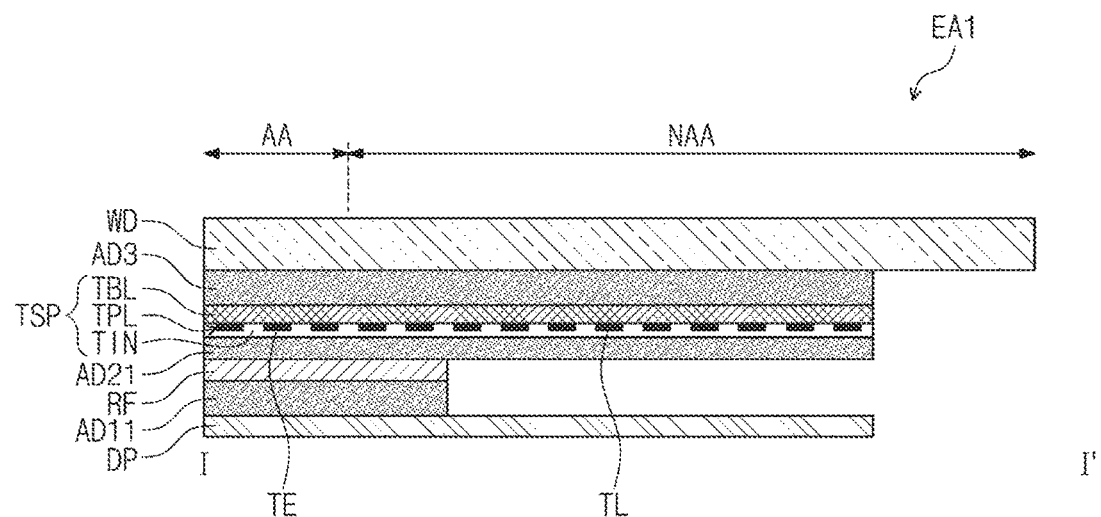
FIGS. 9A, 9B, 9C, and 9D are cross-sectional views of the display apparatus shown in FIG. 3 taken along lines I-I', II-II', III-III', and IV-IV', respectively, illustrating a display apparatus according to another exemplary embodiment.
Figure 9B:
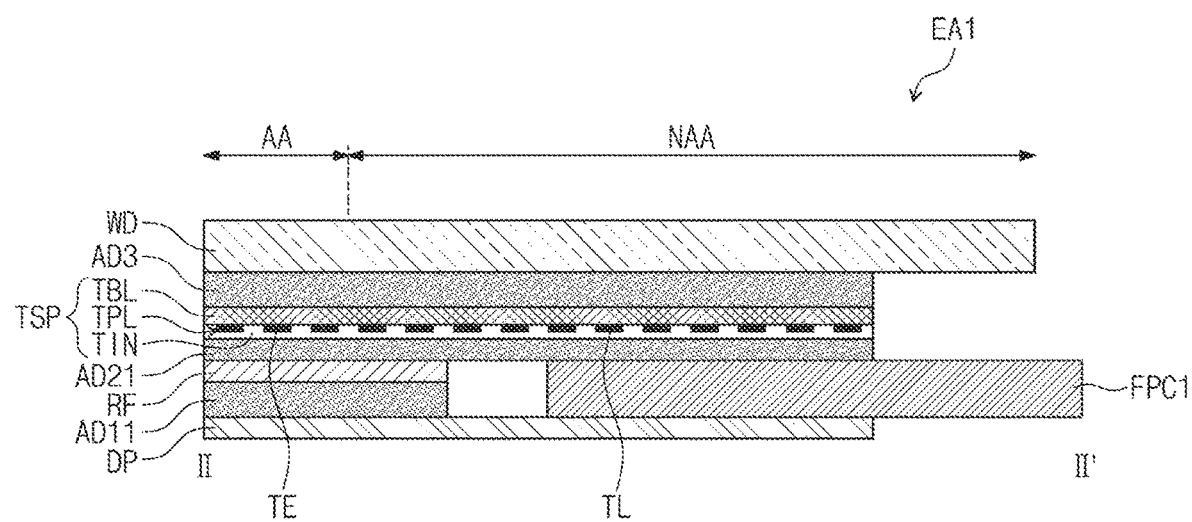
Figure 9C:
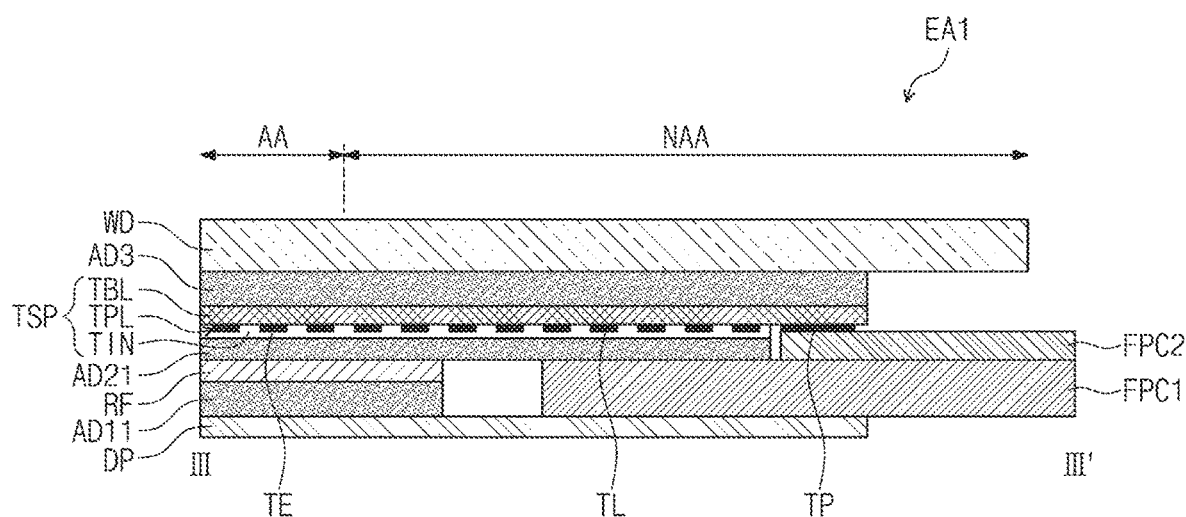
Figure 9D:
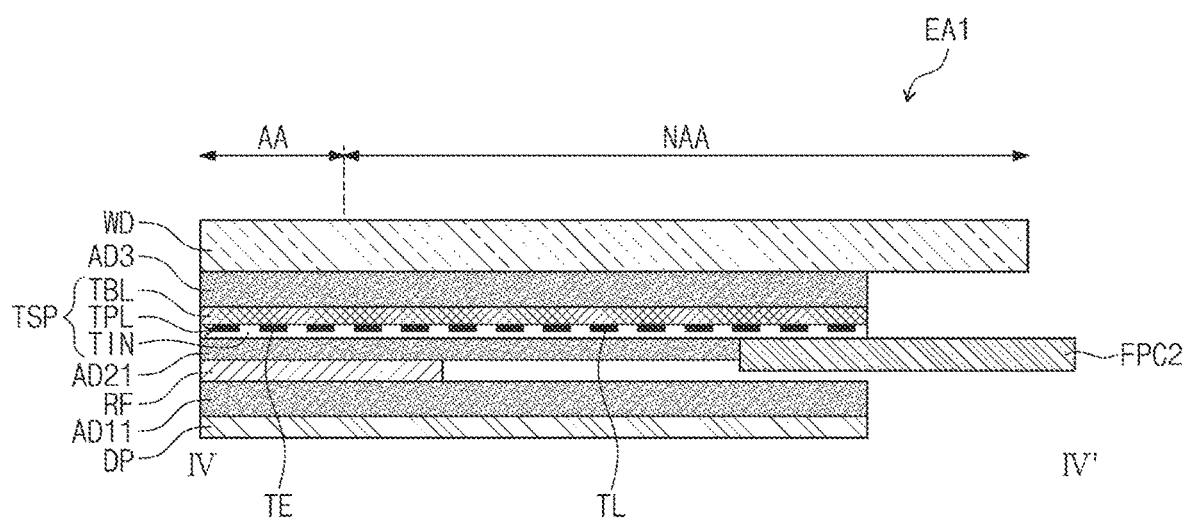

FIG. 7 is a cross-sectional view of a display apparatus according to a comparative, conventional example, and FIG. 8 is a schematic view illustrating a touch sensing unit when water permeates into the touch screen panel of the display apparatus of FIG. 7. Effects of the embodiment of the invention described with reference to FIGS. 1 to 6D will be described in more detail with reference to FIGS. 7 and 8.

In a display apparatus EA-1 of FIGS. 7 and 8, components corresponding to the components of the display apparatus EA of FIGS. 6A to 6D will be indicated by reference designators obtained by adding "–1" to the reference designators of the components of the display apparatus EA of FIGS. 6A to 6D. For example, a window member WD-1 of FIG. 7 may have a substantially similar function to the window member WD described with reference to FIGS. 6A to 6D.

In FIG. 7, a first adhesive layer AD1-1 and a second adhesive layer AD2-1 may be spaced apart from a first flexible printed circuit board FPC1-1 and a second flexible printed circuit board FPC2-1. The first adhesive layer AD1-1 and the second adhesive layer AD2-1 may expose a touch insulating layer TIN-1 overlapping with the first flexible printed circuit board FPC1-1.

As the display apparatus EA-1 is out-folded, the touch insulating layer TIN-1 may be stabbed with an upper edge EG1 of the first flexible printed circuit board FPC1-1. Since the touch insulating layer TIN-1 is very thin, the touch insulating layer TIN-1 may be easily broken by the upper edge EG1 of the first flexible printed circuit board FPC1-1. In addition, touch patterns TPL-1 may also be damaged or broken by the upper edge EG1.

In the display apparatus EA described with reference to FIGS. 6A to 6D, since the first adhesive layer AD1 is in contact with the side surface 11 and the top surface 12 of the first flexible printed circuit board FPC1, the touch insulating layer TIN is not directly stabbed with the first flexible printed circuit board FPC1 even though the display apparatus EA is out-folded. At this time, the first adhesive layer AD1 may absorb an impact applied by the first flexible printed circuit board FPC1. In addition, the first adhesive layer AD1 may absorb an impact applied to the touch insulating layer TIN in manufacturing processes and/or an impact applied to the touch insulating layer TIN by carelessness in handling.

As a result, in the display apparatus EA according to the embodiment of the invention described with reference to FIGS. 1 to 6D, the impact applied to the touch insulating layer TIN may be reduced or buffered by the first adhesive layer AD1, and thus it is possible to prevent the touch insulating layer TIN and the touch patterns TPL from being damaged.

Referring to FIGS. 7 and 8, in the comparative example, the first flexible printed circuit board FPC1-1 may not be adhered to the second flexible printed circuit board FPC2-1, and thus water WT may permeate through a path PTH between the first and second flexible printed circuit boards FPC1-1 and FPC2-1. The permeated water WT may be in contact with the exposed touch insulating layer TIN and may mainly overlap with touch interconnection lines TL-1 among the touch patterns TPL-1.

Since the touch insulating layer TIN-1 is relatively thin, proper capacitances of the touch interconnection lines TL-1 are changed by the permeated water WT. Thus, a touch sensing unit TSP-1 may not sense touch coordinates in an area where touch electrodes connected to the lines TL-1 overlapping with the water WT are disposed.

In particular, when the touch electrodes TE1 to TE12 are disposed on the same layer and are arranged in the matrix form in the active area AA2 like FIG. 5 (e.g., a self-capacitance structure), the touch sensing unit TSP needs interconnection lines respectively connected to the touch electrodes TE1 to TE12. The self-capacitance structure needs a relatively large number of touch interconnection lines as compared with a mutual-capacitance structure, which senses a touch based on a variation in capacitance of two touch lines extending in different directions and insulated from each other, on the assumption that they have the same touch resolution. Thus, spaces between the interconnection lines of the self-capacitance structure may be narrower than spaces between the interconnection lines of the mutual-capacitance structure. As a result, the self-capacitance structure may be more easily damaged by the permeated water WT.

In the display apparatus EA described with reference to FIGS. 6A to 6D, the first adhesive layer AD1 is disposed between the first and second flexible printed circuit boards FPC1 and FPC2 to adhere the first and second flexible printed circuit boards FPC1 and FPC2 to each other. Thus, the first adhesive layer AD1 prevents a path, through which water permeates, from being formed between the first and second flexible printed circuit boards FPC1 and FPC2.

As a result, the display apparatus EA according to the embodiment of the invention described with reference to FIGS. 1 to 6D can prevent malfunction of the touch sensing unit TSP by permeation of water.

FIGS. 9A, 9B, 9C, and 9D are cross-sectional views of the display apparatus shown in FIG. 3 taken along lines I-I', II-II', III-III', and IV-IV', respectively, illustrating a display apparatus according to another exemplary embodiment.

First and second adhesive layers AD11 and AD21 of a display apparatus EA1 of FIGS. 9A to 9D are different from the first and second adhesive layers AD1 and AD2 of the display apparatus EA of FIGS. 6A to 6D, and other components of the display apparatus EA1 may be substantially the same or similar as corresponding components of the display apparatus EA of FIGS. 6A to 6D. Hereinafter, the first adhesive layer AD11 and the second adhesive layer AD21 will be mainly described in detail, and the descriptions to the same or similar components as in the embodiment of FIGS. 6A to 6D will be omitted to avoid redundancy.

The first adhesive layer AD11 may be disposed between the display panel DP and the anti-reflection layer RF to adhere the display panel DP and the anti-reflection layer RF to each other.

The first adhesive layer AD11 may not overlap with the first flexible printed circuit board FPC1 and may be spaced apart from the first flexible printed circuit board FPC1.

The second adhesive layer AD21 may be disposed between the touch sensing unit TSP and the anti-reflection layer RF to adhere the touch sensing unit TSP and the anti-reflection layer RF to each other.

The second adhesive layer AD21 may be in contact with the touch insulating layer TIN. The second adhesive layer AD21 may overlap with the first flexible printed circuit board FPC1 and may be in contact with the first flexible printed circuit board FPC1. The second adhesive layer AD21 may be disposed between the first flexible printed circuit board FPC1 and the touch sensing unit TSP to adhere the first flexible printed circuit board FPC1 and the touch sensing unit TSP to each other. The second adhesive layer AD21 may not be disposed between the first flexible printed circuit board FPC1 and the second flexible printed circuit board FPC2.

The second adhesive layer AD21 may be in contact with the touch insulating layer TIN and may cover the most part of the touch insulating layer TIN.

In the display apparatus EA1 described with reference to FIGS. 9A to 9D, an impact applied to the touch insulating layer TIN may be reduced or buffered by the second adhesive layer AD21, and thus it is possible to prevent the touch insulating layer TIN and the touch patterns TPL from being damaged. In addition, the second adhesive layer AD21 covers the touch insulating layer TIN, and thus it is possible to prevent malfunction of the touch sensing unit TSP, which may be caused by water being in contact with the touch insulating layer TIN.

Figure 10A:
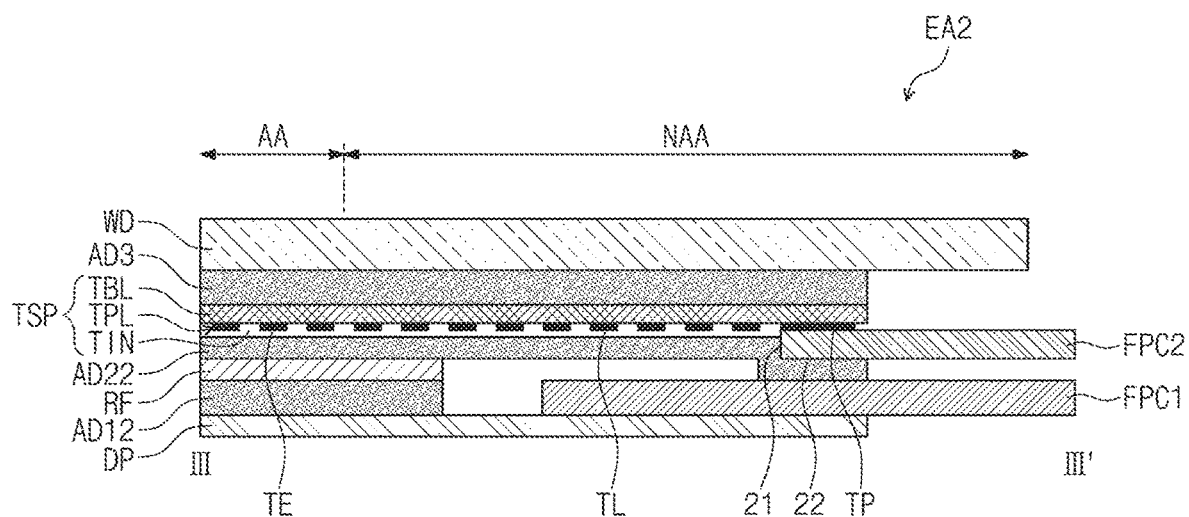
FIGS. 10A and 10B are cross-sectional views of the display apparatus shown in FIG. 3 taken along lines III-III' and IV-IV', respectively, illustrating a display apparatus according to still another exemplary embodiment.
Figure 10B:
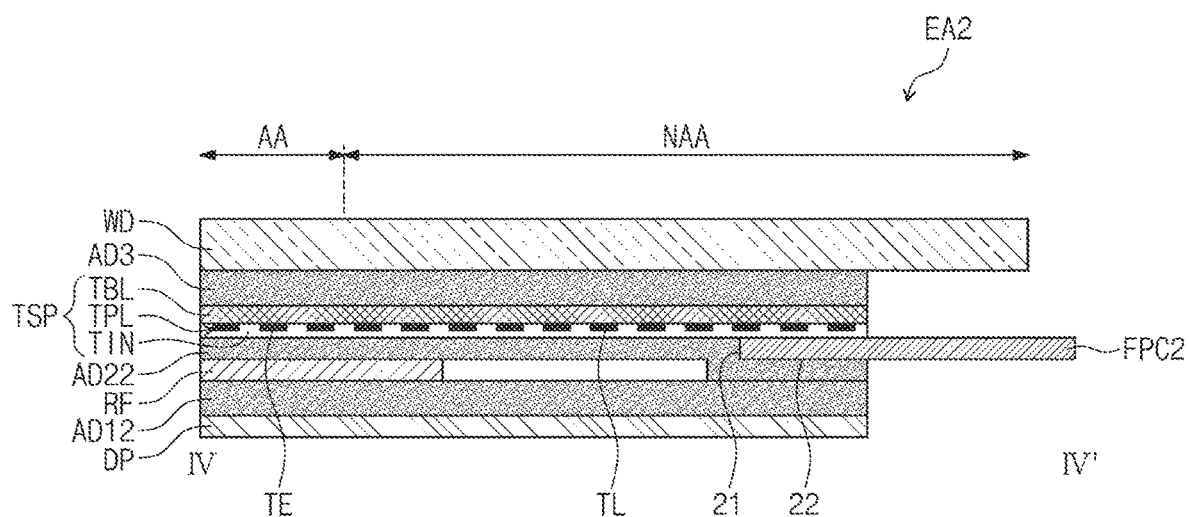
Figure 11A:
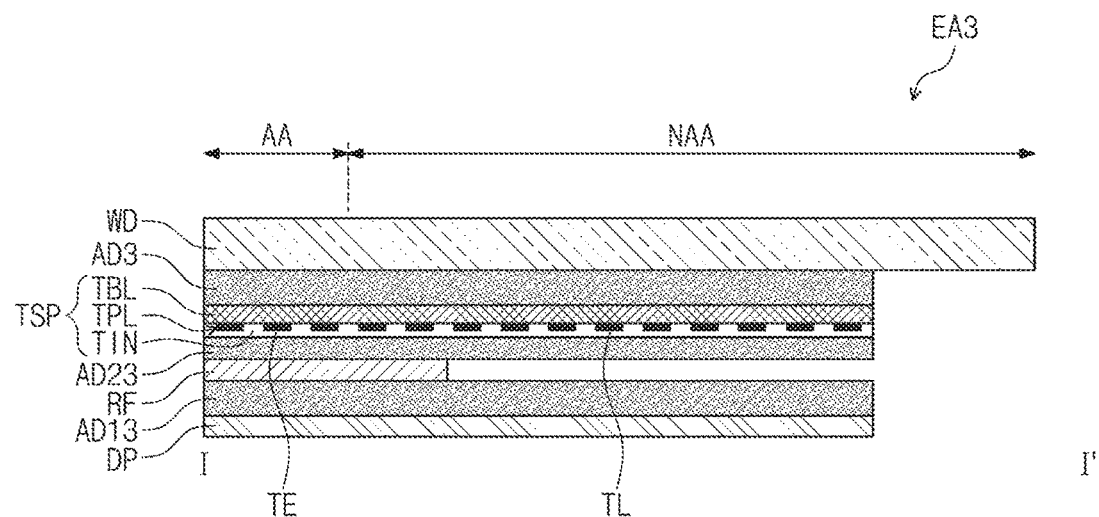
FIGS. 11A, 11B, 11C, and 11D are cross-sectional views of the display apparatus shown in FIG. 3 taken along lines I-I', II-II', III-III', and IV-IV', respectively, illustrating a display apparatus according to yet another exemplary embodiment.
Figure 11B:
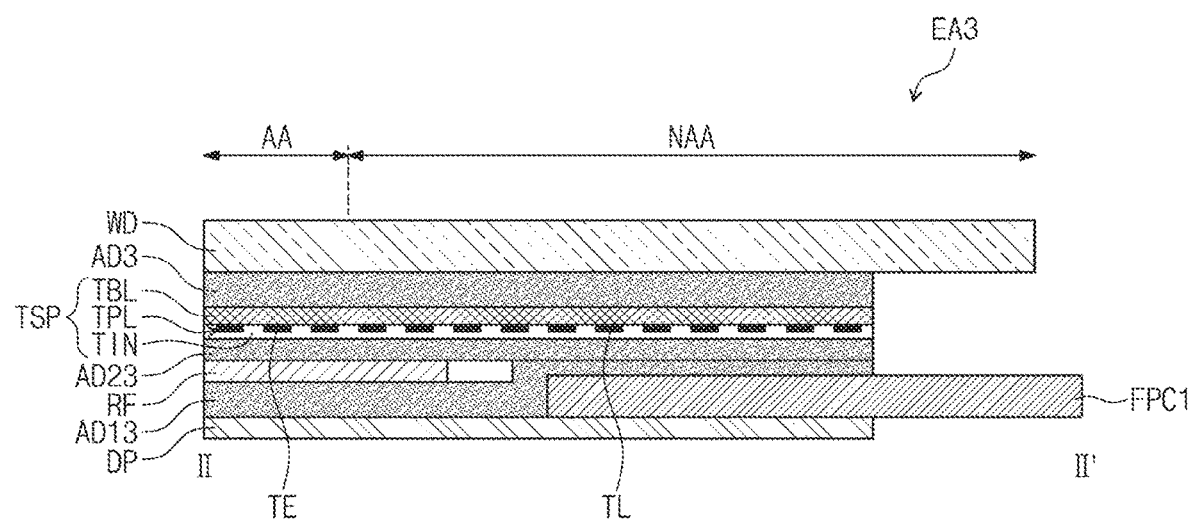
Figure 11C:
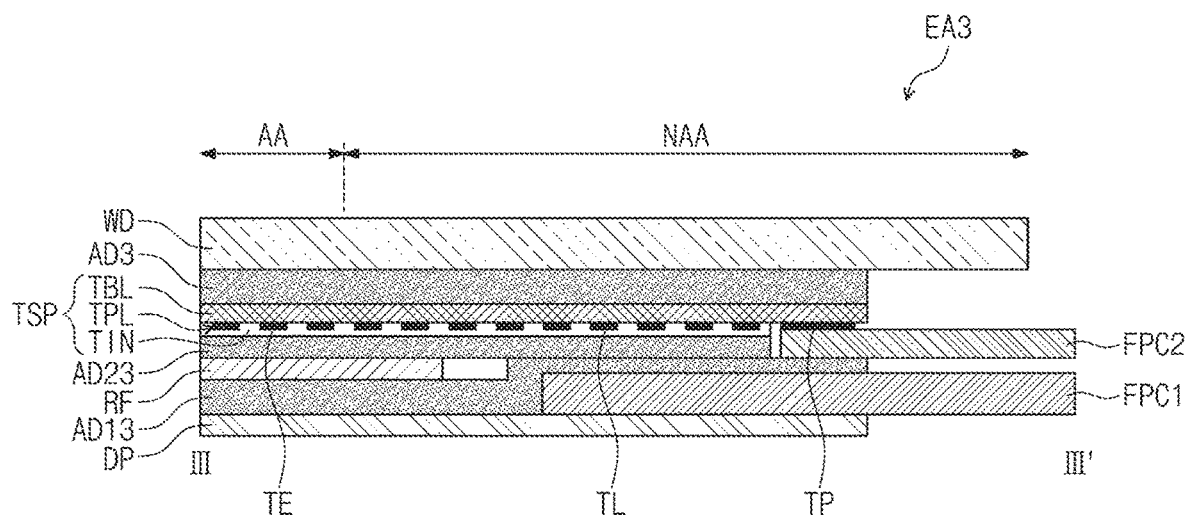
Figure 11D:
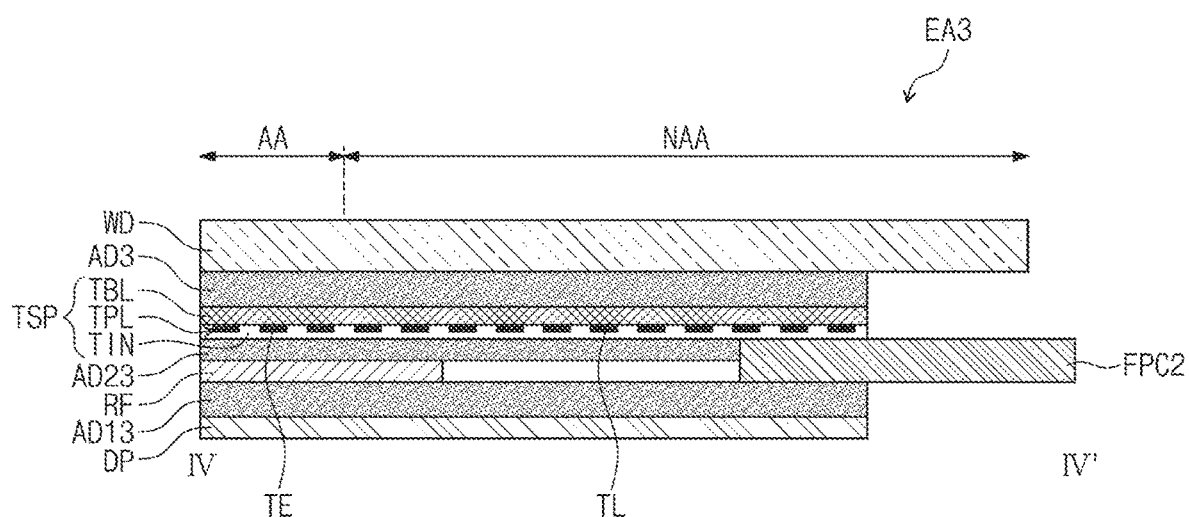
Figure 12A:
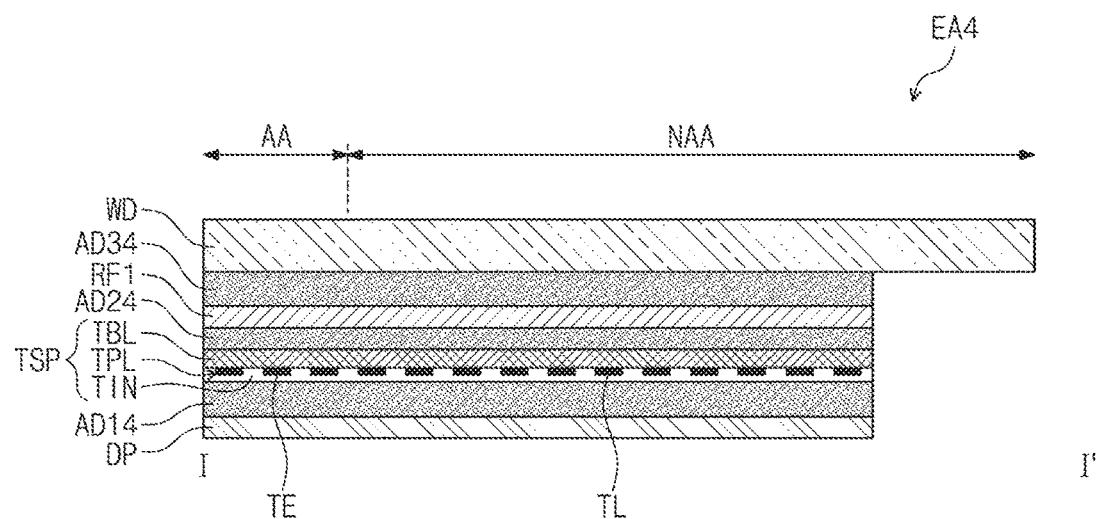
FIGS. 12A, 12B, 12C, and 12D are cross-sectional views of the display apparatus shown in FIG. 3 taken along lines I-I', II-II', III-III', and IV-IV', respectively, illustrating a display apparatus according to yet still another exemplary embodiment.
Figure 12B:
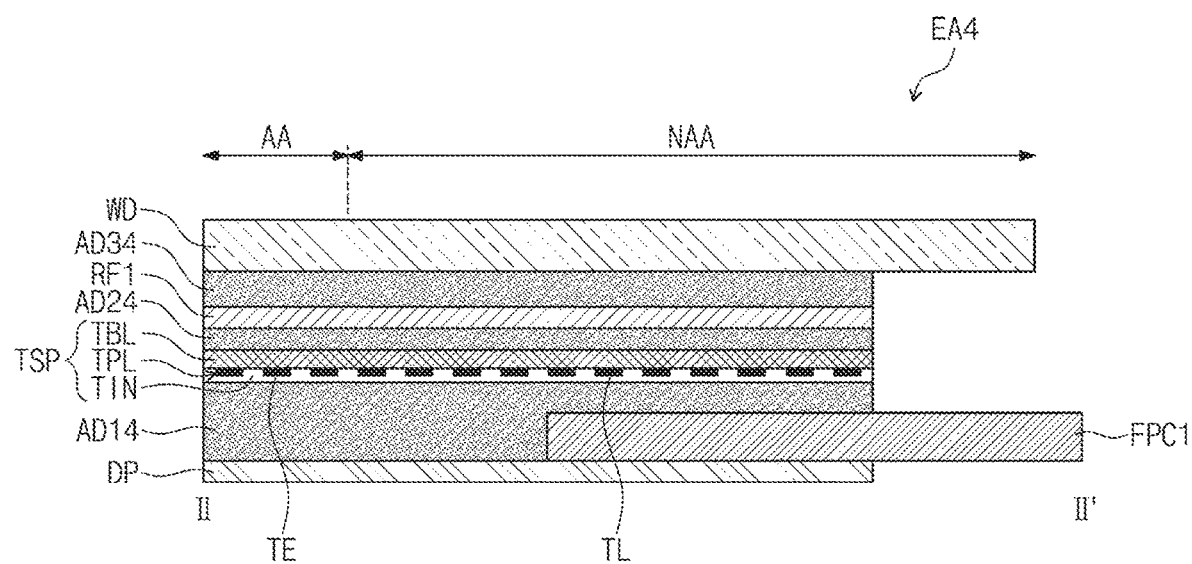
Figure 12C:
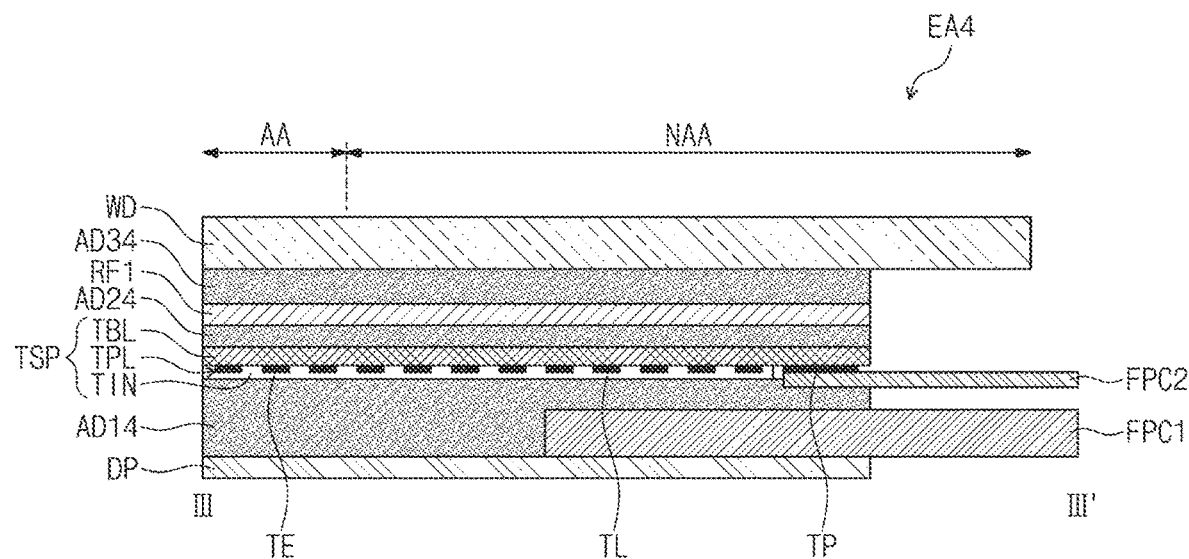
Figure 12D:
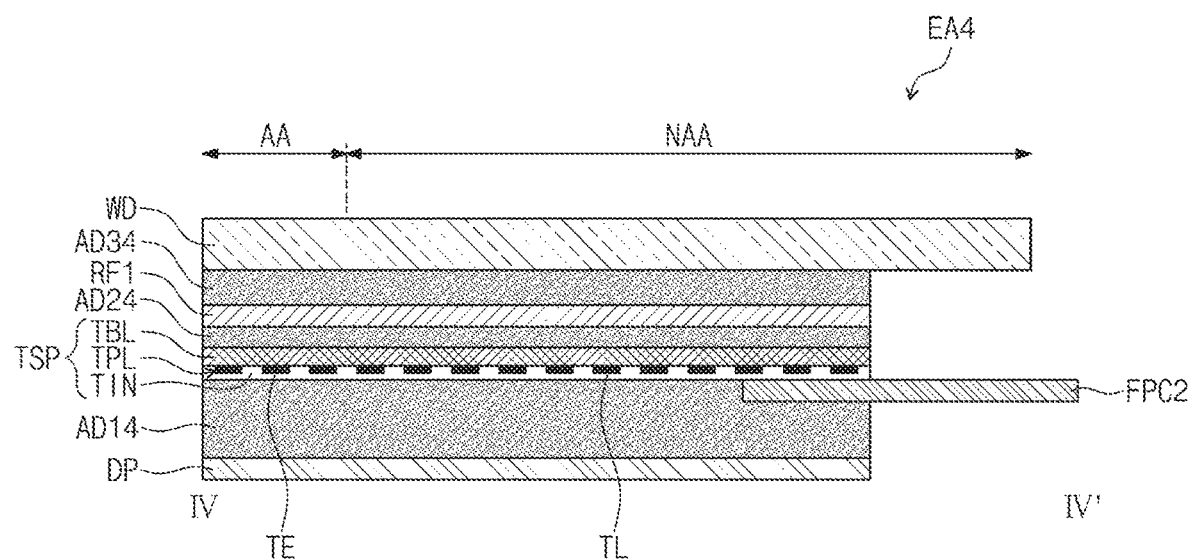

FIGS. 10A and 10B are cross-sectional views of the display apparatus shown in FIG. 3 taken along lines III-III' and IV-IV', respectively, illustrating a display apparatus according to still another exemplary embodiment.

A second adhesive layer AD22 of a display apparatus EA2 of FIGS. 10A and 10B is different from the second adhesive layer AD21 of the display apparatus EA1 of FIGS. 9A to 9D, and other components of the display apparatus EA2 may be substantially the same or similar as corresponding components of the display apparatus EA1 of FIGS. 9A to 9D. Hereinafter, the second adhesive layer AD22 will be mainly described in detail, and the descriptions to the same or similar components as in the embodiment of FIGS. 9A to 9D will be omitted or mentioned briefly to avoid redundancy.

A first adhesive layer AD12 may not overlap with the first flexible printed circuit board FPC1 and may be spaced apart from the first flexible printed circuit board FPC1.

The second adhesive layer AD22 may be disposed between the touch sensing unit TSP and the anti-reflection layer RF. In addition, the second adhesive layer AD22 may overlap with at least a portion of the second flexible printed circuit board FPC2 and may be in contact with the first flexible printed circuit board FPC1.

The second adhesive layer AD22 may extend between the first flexible printed circuit board FPC1 and the second flexible printed circuit board FPC2. The second adhesive layer AD22 may be in contact with a side surface 21 and a bottom surface 22 of the second flexible printed circuit board FPC2. The second adhesive layer AD22 may be in contact with the first flexible printed circuit board FPC1 and the second flexible printed circuit board FPC2 to adhere the first and second flexible printed circuit boards FPC1 and FPC2 to each other.

In the display apparatus EA2 described with reference to FIGS. 10A and 10B, an impact applied to the touch insulating layer TIN may be reduced or buffered by the second adhesive layer AD22, and thus it is possible to prevent the touch insulating layer TIN and the touch patterns TPL from being damaged. In addition, the second adhesive layer AD22 prevents a path, through which water permeates, from being formed between the first and second flexible printed circuit boards FPC1 and FPC2, and thus it is possible to prevent malfunction of the touch sensing unit TSP which may be caused by the permeation of water.

FIGS. 11A, 11B, 11C, and 11D are cross-sectional views of the display apparatus shown in FIG. 3 taken along lines I-I', II-II', III-III', and IV-IV', respectively, illustrating a display apparatus according to yet another exemplary embodiment.

A second adhesive layer AD23 of a display apparatus EA3 of FIGS. 11A to 11D is different from the second adhesive layer AD2 of the display apparatus EA of FIGS. 6A to 6D, and other components of the display apparatus EA3 may be substantially the same or similar as corresponding components of the display apparatus EA of FIGS. 6A to 6D. Hereinafter, a first adhesive layer AD13 and the second adhesive layer AD23 will be mainly described in detail, and the descriptions to the same or similar components as in the embodiment of FIGS. 6A to 6D will be omitted to avoid redundancy.

Referring to FIGS. 11A to 11D, the first adhesive layer AD13 may be disposed between the display panel DP and the anti-reflection layer RF to adhere the display panel DP and the anti-reflection layer RF to each other. The first adhesive layer AD13 may be in contact with the first flexible printed circuit board FPC1. The first adhesive layer AD13 may extend between the first flexible printed circuit board FPC1 and the second flexible printed circuit board FPC2 to adhere the first and second flexible printed circuit boards FPC1 and FPC2 to each other.

The second adhesive layer AD23 may be disposed between the touch sensing unit TSP and the anti-reflection layer RF to adhere the touch sensing unit TSP and the anti-reflection layer RF to each other.

The second adhesive layer AD23 may be in contact with the touch insulating layer TIN. The second adhesive layer AD23 may overlap with at least a portion of the first flexible printed circuit board FPC1.

The first adhesive layer AD13 and the second adhesive layer AD23 may be in contact with each other in an area where they overlap with the first flexible printed circuit board FPC1.

In the display apparatus EA3 described with reference to FIGS. 11A to 11D, an impact applied to the touch insulating layer TIN may be reduced or buffered by the first adhesive layer AD13 and the second adhesive layer AD23, and thus it is possible to prevent the touch insulating layer TIN and the touch patterns TPL from being damaged. In addition, the first adhesive layer AD13 prevents a path, through which water permeates, from being formed between the first and second flexible printed circuit boards FPC1 and FPC2, and thus it is possible to prevent malfunction of the touch sensing unit TSP which may be caused by the permeation of water.

FIGS. 12A, 12B, 12C, and 12D are cross-sectional views of the display apparatus shown in FIG. 3 taken along lines I-I', II-II', III-III', and IV-IV', respectively, illustrating a display apparatus according to yet still another exemplary embodiment.

An anti-reflection layer RF1, a first adhesive layer AD14 and a second adhesive layer AD24 of a display apparatus EA4 of FIGS. 12A to 12D are different from those of the display apparatus EA of FIGS. 6A to 6D, and other components of the display apparatus EA4 may be substantially the same or similar as corresponding components of the display apparatus EA of FIGS. 6A to 6D. Hereinafter, the anti-reflection layer RF1, the first adhesive layer AD14 and the second adhesive layer AD24 will be mainly described in detail, and the descriptions to the same or similar components as in the embodiment of FIGS. 6A to 6D will be omitted or mentioned briefly to avoid redundancy.

The anti-reflection layer RF1 may be disposed between the window member WD and the touch sensing unit TSP.

The second adhesive layer AD24 may be disposed between the anti-reflection layer RF1 and the touch sensing unit TSP to adhere the anti-reflection layer RF1 and the touch sensing unit TSP to each other.

A third adhesive layer AD34 may be disposed between the anti-reflection layer RF1 and the window member WD to adhere the anti-reflection layer RF1 and the window member WD to each other.

The first adhesive layer AD14 may be disposed between the display panel DP and the touch sensing unit TSP to adhere the display panel DP and the touch sensing unit TSP to each other. In addition, the first adhesive layer AD14 may be disposed between the first flexible printed circuit board FPC1 and the touch sensing unit TSP to adhere the first flexible printed circuit board FPC1 and the touch sensing unit TSP to each other.

The first adhesive layer AD14 may be in contact with the touch insulating layer TIN. The first adhesive layer AD14 may be disposed between the first and second flexible printed circuit boards FPC1 and FPC2 and may be in contact with the first and second flexible printed circuit boards FPC1 and FPC2 to adhere the first and second flexible printed circuit boards FPC1 and FPC2 to each other.

In the display apparatus EA4 described with reference to FIGS. 12A to 12D, an impact applied to the touch insulating layer TIN may be reduced or buffered by the first adhesive layer AD14, and thus it is possible to prevent the touch insulating layer TIN and the touch patterns TPL from being damaged. In addition, the first adhesive layer AD14 prevents a path, through which water permeates, from being formed between the first and second flexible printed circuit boards FPC1 and FPC2, and thus it is possible to prevent malfunction of the touch sensing unit TSP which may be caused by the permeation of water.

The display apparatus according to the principles and embodiments of the invention can prevent the touch insulating layer and the touch patterns from being damaged when the display apparatus is folded. In addition, the display apparatus according to the principles and embodiments of the invention can prevent the malfunction of the touch sensing unit, which may be caused by the permeation of water.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a display panel to display an image;
a touch sensor disposed on the display panel;
an adhesive layer disposed between the display panel and the touch sensor;
a first flexible printed circuit board disposed between the display panel and the touch sensor and connected to the display panel; and
a second flexible printed circuit board disposed between the display panel and the touch sensor and connected to the touch sensor,
wherein the adhesive layer overlaps with the first flexible printed circuit board and is in contact with the first flexible printed circuit board and the touch sensor.

2. The display apparatus of claim 1, wherein the touch sensor is a touch sensing unit comprising:
a base layer;
touch patterns disposed under the base layer; and
a touch insulating layer disposed under the touch patterns to cover the touch patterns,
wherein the adhesive layer is in contact with the touch insulating layer.

3. The display apparatus of claim 1, further comprising:
an anti-reflection layer disposed between the display panel and the touch sensor,
wherein the adhesive layer is disposed between the display panel and the anti-reflection layer.

4. The display apparatus of claim 3, wherein the adhesive layer is in contact with the first flexible printed circuit board and the second flexible printed circuit board to adhere the first and second flexible printed circuit boards to each other.

5. The display apparatus of claim 3, wherein the adhesive layer is in contact with a top surface and a side surface of the first flexible printed circuit board.

6. The display apparatus of claim 1, further comprising:
an anti-reflection layer disposed between the display panel and the touch sensor,
wherein the adhesive layer is disposed between the touch sensor and the anti-reflection layer.

7. The display apparatus of claim 6, wherein the adhesive layer is in contact with a top surface of the first flexible printed circuit board.

8. The display apparatus of claim 6, wherein the adhesive layer is disposed between the first flexible printed circuit board and the second flexible printed circuit board and is in contact with the first flexible printed circuit board and the second flexible printed circuit board.

9. The display apparatus of claim 8, wherein the adhesive layer is in contact with a bottom surface and a side surface of the second flexible printed circuit board.

10. The display apparatus of claim 1, further comprising:
an anti-reflection layer disposed between the display panel and the touch sensor, wherein the adhesive layer comprises:
a first adhesive layer disposed between the display panel and the anti-reflection layer; and
a second adhesive layer disposed between the anti-reflection layer and the touch sensor.

11. The display apparatus of claim 10, wherein the first adhesive layer is in contact with the first flexible printed circuit board, and
wherein the second adhesive layer is in contact with the touch sensor.

12. The display apparatus of claim 10, wherein the first adhesive layer is in contact with the first and second flexible printed circuit boards to adhere the first and second flexible printed circuit boards to each other, and
wherein the second adhesive layer overlaps with the first flexible printed circuit board.

13. The display apparatus of claim 10, wherein the first adhesive layer and the second adhesive layer are in contact with each other in an area where the first and second adhesive layers overlap with the first flexible printed circuit board.

14. The display apparatus of claim 1, further comprising:
a window member disposed on the touch sensor; and
an anti-reflection layer disposed between the touch sensor and the window member,
wherein the adhesive layer is in contact with the display panel and the touch sensor to adhere the display panel and the touch sensor to each other.

15. The display apparatus of claim 14, wherein the adhesive layer is disposed between the first and second flexible printed circuit boards and adheres the first and second flexible printed circuit boards to each other.

16. A display apparatus comprising:
a display panel that includes a touch screen surface to display an image and is foldable on a folding axis such that the touch screen surface faces outward;
a touch sensing unit disposed on the display panel including a base layer, touch patterns disposed under the base layer, and a touch insulating layer disposed under the touch patterns to cover the touch patterns, wherein the base layer is further away from the display panel than the touch insulating layer;

an adhesive layer disposed between the display panel and the touch sensing unit; and a first flexible printed circuit board disposed between the display panel and the touch sensing unit and connected to the display panel, and wherein the adhesive layer overlaps with the first flexible printed circuit board and is in contact with the first flexible printed circuit board and the touch insulating layer.

17. The display apparatus of claim 16, further comprising:
a second flexible printed circuit board disposed between the display panel and the touch sensing unit and connected to the touch sensing unit, wherein the adhesive layer is disposed between the first and second flexible printed circuit boards to adhere the first and second flexible printed circuit boards to each other.

18. The display apparatus of claim 16, further comprising:
an anti-reflection layer disposed between the display panel and the touch sensing unit, wherein the adhesive layer is disposed between the display panel and the anti-reflection layer.

19. The display apparatus of claim 16, further comprising:
an anti-reflection layer disposed between the display panel and the touch sensing unit, wherein the adhesive layer is disposed between the touch sensing unit and the anti-reflection layer.

20. A display apparatus comprising: a display panel configured to display an image;

a touch sensor disposed on the display panel;

an adhesive layer disposed between the display panel and the touch sensor; and a first flexible printed circuit board disposed between the display panel and the touch sensor and connected to the display panel, wherein the adhesive layer is in contact with a top surface and a side surface of the first flexible printed circuit board.

21. A display apparatus comprising:
a foldable display panel to display an image;

a touch sensing unit disposed on the display panel including touch patterns and a touch insulating layer covering the touch patterns;

an adhesive layer disposed between the display panel and the touch sensing unit; and at least one flexible printed circuit board having a corner and being disposed between the display panel and the touch sensing unit, and connected for rotation with the display panel, and wherein the adhesive layer protects the corner of the at least one flexible printed circuit board from contacting the touch insulation layer upon rotation of the display panel during folding of the display panel.

* * * * *